United States Patent [19]

Bösenberg

[11] 4,239,790

[45] Dec. 16, 1980

[54] METHOD OF DEFINING A PHOTORESIST LAYER

[75] Inventor: Wolfram A. Bösenberg, Monmouth Junction, N.J.

[73] Assignee: RCA Corporation, New York, N.Y.

[21] Appl. No.: 75,162

[22] Filed: Sep. 12, 1979

[51] Int. Cl.³ .............................................. B05D 3/06
[52] U.S. Cl. .............................. 427/54.1; 250/492 A; 430/327; 430/397; 430/494
[58] Field of Search ..................... 430/24.5, 290, 269, 430/327, 396, 397, 494; 427/54.1, 43.1; 250/492 R, 492 A

[56] References Cited

U.S. PATENT DOCUMENTS

| 3,716,363 | 2/1973 | Ruggerio | 430/5 |
|---|---|---|---|
| 3,890,148 | 6/1975 | Lawson et al. | 430/5 |
| 3,940,274 | 2/1976 | MacAnally | 430/5 |
| 4,023,904 | 5/1977 | Sheets | 250/492 A |
| 4,066,458 | 1/1978 | Stuckert | 250/492 A |
| 4,070,499 | 1/1978 | Ramler | 427/54.1 |
| 4,082,453 | 5/1978 | Knop | 430/269 |
| 4,088,896 | 5/1978 | Elkins et al. | 250/492 A |
| 4,133,702 | 1/1979 | Krimmel | 250/492 A |

*Primary Examiner*—John H. Newsome
*Attorney, Agent, or Firm*—Birgit E. Morris; D. S. Cohen; Sanford J. Asman

[57] ABSTRACT

The method entails vibrating the wafer during the exposure of the photoresist in order to eliminate standing waves which occur in layers parallel to the surface of the photoresist layer and which cause alternately exposed and unexposed layers of the photoresist to be present.

5 Claims, 1 Drawing Figure

U.S. Patent
Dec. 16, 1980
4,239,790
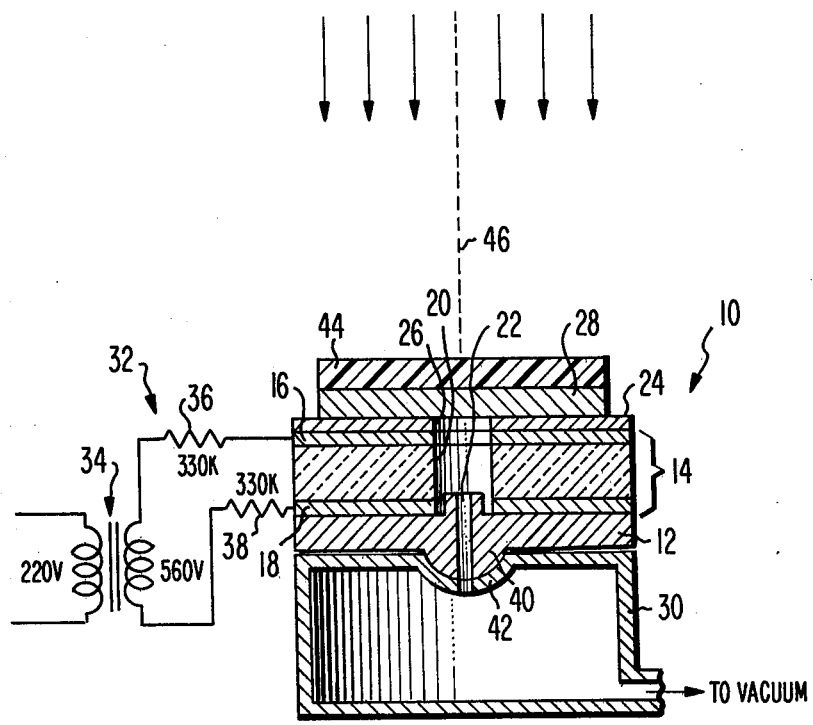

METHOD OF DEFINING A PHOTORESIST LAYER

BACKGROUND OF THE INVENTION

The present invention relates to a method for defining a photoresist of the type used in the manufacture of integrated circuits.

Integrated circuits are manufactured using photolithographic techniques which entail photoengraving and etching. In order to manufacture an integrated circuit, a number of photomasks are used to define different areas for diffusion, etching, oxidation, metallization, and other processes. Typically, the alignment of photomasks with the silicon wafer or substrate is done using a light having a wavelength which will not expose a photoresist layer which has been applied to the wafer. When the wafer and the photomask are in registration, the photoresist is exposed by another light having a wavelength which is shorter than the wavelength of the light used for alignment purposes. Typically, the light used for exposure is in the ultraviolet range, whereas the light used for alignment is in the visible range.

Since the photoresist layer has a thickness which is optically comparable to the wavelength of light used for exposure, standing waves occur in the photoresist layer. Such standing waves result in nonuniform exposure of the photoresist in that alternating layers parallel to the wafer surface are exposed and unexposed. As this is clearly undesirable, the manufacturers of photoresist materials have attempted to sensitize photoresists over a larger range of wavelengths in order to help to eliminate such layering. In that regard, positive photoresists are less prone to layering than are negative photoresists.

SUMMARY OF THE INVENTION

The present invention is a method for defining a photoresist layer wherein a substrate with the photoresist layer applied thereon is vibrated, with the vibratory motion being along a single axis. The photoresist layer is exposed with light having an optical axis which is substantially parallel to the single axis along which the substrate is vibrating. The wavelength of the light is selected to expose the photoresist layer, and the amplitude of the vibration motion of the substrate is approximately one wavelength.

BRIEF DESCRIPTION OF THE DRAWINGS

In the drawings:

The FIGURE of the drawing is a cross-sectional schematic view of a vibrating wafer holder used in the method of the present invention.

DETAILED DESCRIPTION OF AN EXEMPLARY EMBODIMENT

In order to eliminate the problems of non-exposure described above, the method of the present invention entails vibrating the semiconductor wafer with a typical amplitude of between about 0.5–2.0 micrometers along the optical axis. While such vibration will not fully remove the standing wave problem, it will sufficiently improve the pattern definition. It is important that the vibratory motion exist only along the axis of the optical light path in order to avoid improperly exposing areas of the photoresist which are not to be exposed.

Referring to the drawing, an apparatus 10 which can be used in carrying out the method of the present invention is shown. The apparatus 10 comprises a vacuum chuck 12 and a cylindrical piezoelectric element 14, as used in the preferred embodiment of the invention. The piezoelectric element 14 comprises silver contact layers 16, 18 on the upper and lower surfaces, respectively. A central hole 20 extends through the piezoelectric element 14 and aligns with a central hole 22 in the vacuum chuck 12. A metal disc 24 having a central hole 26 therein lies over the surface of the piezoelectric element 14 with the central holes 26, 20, 22 all aligned. The purpose of the metal disc 24 is to provide surface matching between a semiconductor substrate, or wafer 28, and the upper silver layer 16 of the piezoelectric element 14. Accordingly, when vacuum is present in a vacuum chamber 30, the wafer 28 is held securely in place.

An alternating voltage is established across the piezoelectric element 14 by a circuit 32 comprising a transformer 34 and a pair of resistors 36, 38 which each have a value of 330,000 ohms as used in the preferred embodiment of the invention. The transformer 34 is used to provide an alternating output voltage of about 560 volts when used with a 220 volt a.c. source. That voltage is adequate to vibrate the piezoelectric element 14 with a wafer 28 on it by about 1 order of optical interference, i.e. about 1–2 micrometers.

In operation, the apparatus 10 is used to expose a photoresist layer 44 which is on the surface of the wafer 28. The apparatus 10 and the present method may be used either in projection or in proximity printing machines of the type used in semiconductor manufacture. In the case of projection printing, the pattern should be focused on the photoresist layer 44 while the wafer 28 is in the neutral position in order for the vibrations to shift the layer 44 through the whole range and depth of field. In a contact printing apparatus, the wafer 28 is brought into light contact with a photomask (not shown) in order to place the wafer 28 and the photomask in parallel planes before sufficient vacuum is applied to lock the elements of the apparatus 10 in position. To assist such action, the vacuum chuck 12 has a hemispherical male portion 40 which matches and fits into a hemispherical female portion 42 in the vacuum chamber 30. The hemispherical portions 40, 42 allow for relative movement between the wafer 28 and the photomask (not shown) in order that the wafer 28 can be brought into planar relationship with the photomask. Obviously, the hemispherical portions 40, 42 would not be required in a projection printing apparatus. Thereafter, vacuum sufficient to fix the elements of the apparatus 10 into position is applied. In the preferred embodiment of the invention, the piezoelectric element 14 which is used comprises a disc having a diameter of about 37 mm, a thickness of about 6 mm and which has a central hole 20 having a diameter of about 12 mm. The element 14 is comprised of PZT material manufactured by Veritron of Bedford, Ohio.

The element 14 vibrates the wafer 28 at a frequency of 60 Hz when standard U.S. a.c. is used. Obviously, if the apparatus 10 is used in an area where a.c. has a frequency other than 60 Hz the element 14 vibrates at a frequency other than 60 Hz. For example, in Europe where the standard a.c. has a frequency of 50 Hz, the element 14 vibrates at 50 Hz. The vibratory motion is along the axis 46 of the optical light path used to expose the photoresist layer 44 (represented by the arrows). The amplitude of vibration of the wafer 28 is on the order of the wavelength of the exposing light.

As an alternative to the apparatus 10, a solid piezoelectric element which has a box adapted to receive a vacuum can be used. The box would have a plurality of holes in its upper surface used for holding a wafer 28 to the combined box and piezoelectric element through the use of a first vacuum line. A second vacuum line would be used for holding the composite box and piezoelectric element to a vacuum chuck of the type shown in the FIGURE of the drawing. In that manner, the wafer 28 could be held to the composite box and piezoelectric element vacuum while the whole structure is aligned with the photomask.

What is claimed is:

1. A method for defining a photoresist layer comprising the steps of:
   (a) applying a photoresist layer onto a substrate;
   (b) vibrating said substrate, the vibratory motion being along a single axis; and
   (c) exposing said photoresist layer with light having an optical axis substantially parallel to said single axis, the wavelength of said light being selected to expose said photoresist layer, and the amplitude of said vibratory motion being approximately one wavelength.

2. The method of claim 1 wherein said light has a wavelength in the ultraviolet range.

3. The method of claim 2 wherein said amplitude of vibratory motion is between about 0.5 and 2.0 micrometers.

4. The method of claim 1 wherein said photoresist layer is applied onto a substantially planar surface of said substrate.

5. The method of claim 4 wherein said single axis is normal to said substantially planar surface.

* * * * *